United States Patent
Kim et al.

(10) Patent No.: US 9,638,752 B2
(45) Date of Patent: May 2, 2017

(54) MEASUREMENT CIRCUITRY AND METHOD FOR MEASURING A CLOCK NODE TO OUTPUT NODE DELAY OF A FLIP-FLOP

(71) Applicants: ARM LIMITED, Cambridge (GB); THE REGENTS OF THE UNIVERSITY OF MICHIGAN, Ann Arbor, MI (US)

(72) Inventors: Yejoong Kim, Ann Arbor, MI (US); Dennis Michael Sylvester, Ann Arbor, MI (US); David Theodore Blaauw, Ann Arbor, MI (US); Brian Tracy Cline, Austin, TX (US)

(73) Assignees: ARM Limited, Cambridge (GB); The Regents of the University of Michigan, Ann Arbor, MI (US)

(*) Notice: Subject to any disclaimer, the term of this patent is extended or adjusted under 35 U.S.C. 154(b) by 449 days.

(21) Appl. No.: 14/175,015

(22) Filed: Feb. 7, 2014

(65) Prior Publication Data
US 2015/0226800 A1   Aug. 13, 2015

(51) Int. Cl.
| | | |
|---|---|---|
| *G06F 19/00* | (2011.01) |
| *G01R 31/317* | (2006.01) |
| *H03K 3/03* | (2006.01) |

(52) U.S. Cl.
CPC ..... *G01R 31/31725* (2013.01); *H03K 3/0315* (2013.01)

(58) Field of Classification Search
CPC .... H04L 12/42; H04L 12/433; H04L 12/4637
(Continued)

(56) References Cited

U.S. PATENT DOCUMENTS 5,537,098 A * 7/1996 Patrick ............... H04L 12/42
                                                 370/452
6,499,334 B1   12/2002 Kobayashi
(Continued)

OTHER PUBLICATIONS

Teh et al., "A 77% Energy-Saving 22-Transistor Single-Phase-Clocking D-Flip-Flop with Adaptive-Coupling Configuration in 40nm CMOS", *ISSCC 2011 /Session 19/Low-Power Digital Techniques*, 19.4, 2011, pp. 338-340.
(Continued)

*Primary Examiner* — Edward Raymond
(74) *Attorney, Agent, or Firm* — Pramudji Law Group PLLC; Ari Pramudji

(57) ABSTRACT

A measurement circuit and method are provided for measuring a clock node to output node delay of a flip-flop. A main ring oscillator has a plurality of main unit cells arranged in a ring, with each main unit cell comprising a flip-flop and pulse generation circuitry connected to the output node of the flip-flop. The flip-flop is responsive to receipt of an input clock pulse at the clock node to output a data value transition from the output node, and the pulse generation circuitry then generates from the data value transition an input clock pulse for a next main unit cell in the main ring, whereby the main ring oscillator generates a first output signal having a first oscillation period. A reference ring oscillator has a plurality of reference unit cells arranged to form a reference ring, and generates a second output signal having a second oscillation period, each reference unit cell comprising components configured such that the second oscillation period provides an indication of a propagation delay through the pulse generation circuitry of the main unit cells of the main ring during the first oscillation period. Calculation circuitry then determines the clock node to output node delay of the flip-flop from the first oscillation period and the second oscillation period. This provides a
(Continued)

particularly simple and accurate mechanism for calculating the clock node to output node delay of a flip-flop.

16 Claims, 8 Drawing Sheets

(58) Field of Classification Search
USPC ............................. 702/79, 64–66, 182–185
See application file for complete search history.

(56) References Cited

U.S. PATENT DOCUMENTS

| 7,477,112 B1* | 1/2009 | Pi .................... H03K 3/0315 327/296 |
|---|---|---|
| 2010/0134169 A1 | 6/2010 | Okubo |
| 2011/0109355 A1 | 5/2011 | Sakaguchi et al. |
| 2011/0255353 A1 | 10/2011 | Fukushima et al. |
| 2012/0119800 A1 | 5/2012 | Yamasaki et al. |
| 2015/0226800 A1 | 8/2015 | Kim et al. |

OTHER PUBLICATIONS

Nedovic et al., "A Test Circuit for Measurement of Clocked Storage Element Characteristics", *IEEE Journal of Solid-State Circuits,* vol. 39, No. 8, Aug. 2004, pp. 1294-1304.

Ribas, et al.; Performance and functional test of flip-flops using ring oscillator structure; 2011 IEEE 6th International Design and Test Workshop (IDT); pp. 42-47; Dec. 11, 2011.

Ribas, et al.; Ring oscillators for functional and delay test of latches and flip-flops; Proceedings of the 24th symposium on Integrated circuits and systems design; pp. 67-72; Aug. 30, 2011.

Doung; Circuits for Measurement of Flip-Flop Performance Variability; Research Project, Submitted to the Department of Electrical Engineering and Computer Sciences, University of California at Berkeley; 45 pages; 2008.

* cited by examiner

MEASUREMENT CIRCUITRY AND METHOD FOR MEASURING A CLOCK NODE TO OUTPUT NODE DELAY OF A FLIP-FLOP

BACKGROUND OF THE INVENTION

Field of the Invention

The present invention relates to a measurement circuit and method for measuring a clock node to output node delay of a flip-flop.

Description of the Prior Art

There are many situations where it is desirable to measure the clock node to output node delay of a flip-flop. For example, such flip-flops will often be used extensively in data processing systems, and when designing such data processing systems it is useful to know the clock to output node delay of the flip-flop, along with information about the delay associated with other circuit components. However, the known techniques for measuring the clock to output node delay (hereafter referred to as the C-Q delay) are typically quite complex, and often require the use of sophisticated analog circuits, such as TDC (Time to Digital Converter) circuits, in order to measure the C-Q delay.

Some known techniques for measuring the C-Q delay are illustrated by the following two papers:
[1] Nikola Nedovic et al, "A Test Circuit for Measurement of Clocked Storage Element Characteristics," IEEE J. Solid-State Circuits, vol. 39, no. 8, pp, 1294-1304, August 2004. This paper use many delay lines and extra logic gates (MUXs). The delay lines have capacitors to adjust the delay, and they require custom-layouts (hence increased design-time). Further, there is no way to compensate mismatch errors that occur due to the extra logic gates.
[2] Chen Kong Teh et al, "A 77% Energy-Saving 22-Transistor Single-Phase-Clock ing D-Flip-Flop with Adaptive-Coupling Configuration in 40 nm CMOS," IEEE Int. Solid-State Circuits Conf. (ISSCC) 2011 Dig. Tech. Papers, pp. 338-339, 2011, This paper adds many extra logic gates (XOR, MUXs) to a device under test to measure C-Q delays, but does not provide any mechanism for compensating for any mismatches that they introduce.

Accordingly, it will be appreciated that the known techniques are often complex, requiring many additional components, and often custom layouts, and further suffer from inaccuracies due to mismatch errors that can be introduced. Accordingly, it would be desirable to provide an improved technique for measuring the C-Q delay of a flip-flop.

SUMMARY OF THE INVENTION

Viewed from a first aspect, the present invention provides measurement circuitry for measuring a clock node to output node delay of a flip-flop comprising: a main ring oscillator consisting of a plurality of main unit cells arranged sequentially to form a main ring, each main unit cell comprising a flip-flop and pulse generation circuitry connected to the output node of the flip-flop, the flip-flop being configured to be responsive to receipt of an input clock pulse at the clock node to output a data value transition from the output node, and the pulse generation circuitry being configured to generate from the data value transition an input clock pulse for a next main unit cell in the main ring, whereby the main ring oscillator generates a first output signal having a first oscillation period; a reference ring oscillator consisting of a plurality of reference unit cells arranged sequentially to form a reference ring, and configured to generate a second output signal having a second oscillation period, each reference unit cell comprising components configured such that the second oscillation period provides an indication of a propagation delay through the pulse generation circuitry of the main unit cells of the main ring during the first oscillation period; and calculation circuitry configured to determine the clock node to output node delay of the flip-flop from the first oscillation period and the second oscillation period.

In accordance with the present invention, the measurement circuitry consists of both a main ring oscillator and a reference ring oscillator. The main ring oscillator consists of a plurality of main unit cells, each of which includes a flip-flop and pulse generation circuitry connected to the output node of the flip-flop. The pulse generation circuitry is configured to generate an input clock pulse for a next main unit cell in the main ring when a data value transition occurs on the output node of the flip-flop. By such an approach, an input clock pulse can be propagated around the main ring, and the main ring oscillator generates a first output signal having a first oscillation period indicative of a propagation delay of that input clock pulse.

Each reference unit cell comprises components configured such that the second oscillation period produced by the reference ring oscillator provides an indication of a propagation delay through the pulse generation circuitry of the main unit cells of the main ring during the first oscillation period. As a result, by using both the first oscillation period and the second oscillation period, the propagation delay due to the pulse generation circuitry can be removed, allowing the clock node to output node delay of the flip-flop to be determined.

This provides an accurate mechanism for measuring the C-Q delay of a flip-flop, which enables the propagation delay effects of the pulse generation circuitry used in each main unit cell to be effectively removed during the calculation process, thereby removing an otherwise potential source of inaccuracy in the measured C-Q delay.

The measurement circuitry of the present invention does not require any sophisticated analog circuits, such as TDC circuits, and indeed in one embodiment the pulse generation circuitry can be arranged to consist solely of interconnected digital components which can easily be placed and routed in physical layout without any critical concern on timing. This hence provides a particularly simple and effective mechanism for measuring the C-Q delay of a flip-flop.

In one embodiment, within each main unit cell the pulse generation circuitry is further configured to precondition an input node of the flip-flop such that the data value transition occurs each time an input clock pulse is received at the clock node of the flip-flop. Such functionality can be readily incorporated within the pulse generation circuitry to ensure that every time an input clock pulse is received at the clock node of the flip-flop, a data value transition will occur. In one particular embodiment, for any particular flip-flop, the data value transition will alternate between logic zero to logic one transitions and logic one to logic zero transitions for each successive input clock pulse received. In such an embodiment, the pulse generation circuitry is able to generate the input clock pulse irrespective of the direction of the data value transition.

The pulse generation circuitry can be formed in a variety of ways, but in one embodiment comprises multiplexer circuitry configured to receive as multiplexer inputs both an inverted and a non-inverted version of the data value at the output node of the flip-flop. On occurrence of said data value transition at the output node of the flip-flop, the multiplexer circuitry is configured to initially output the multiplexer input that is transitioning in a first predetermined direction, and then to switch the output to the other multiplexer input, thereby creating the input clock pulse for the next main unit cell. This provides a particularly simple and effective mechanism for generating the input clock pulse. In one embodiment, the width of the input clock pulse is not critical, and in particular does not affect the value of the first output signal produced by the main ring oscillator.

In one embodiment, the first predetermined direction is a logic low to a logic high direction, and accordingly the multiplexer will be configured to initially output the multiplexer input that is transitioning from a logic low to a logic high level, before then switching the output to the other multiplexer input in order to create the input clock pulse (the other multiplexer input completing the pulse by pulling the multiplexer circuitry output from the logic high to the logic low level).

The first output signal can be generated in a variety of ways, but in one embodiment it is provided by one of the multiplexer inputs to the multiplexer circuitry in a predetermined one of the main unit cells, and the input clock pulse is configured to propagate twice around the main ring during the first oscillation period. This causes the components in both input paths to the multiplexer circuitry within each main unit cell to contribute to the delay measured by the first oscillation period.

The reference unit cells within the reference ring oscillator can take a variety of forms, provided they serve to capture the propagation delay through the pulse generation circuitry of the main unit cells of the main ring during the first oscillation period. However, in one embodiment the components in each reference unit cell are hardwired so that, after an input edge transition has been propagated a predetermined number of times around the reference ring, the second oscillation period provides an indication of the propagation delay through the pulse generation circuitry of the main unit cells of the main ring during the first oscillation period. Using the above example where the first output signal generated by the main ring oscillator is provided by one of the multiplexer inputs to the multiplexer circuitry in a selected main unit cell, then the above approach will ensure that once the input edge transition has been propagated twice around the reference ring, the second oscillation period will provide an indication of the propagation delay through the pulse generation circuitry of the main unit cells of the main ring during the first oscillation period.

In one particular embodiment, every alternate reference unit cell is identically constructed.

The number of main unit cells in the main ring oscillator (and indeed the number of reference unit cells in the reference ring oscillator) can be varied dependent on embodiment, but in one embodiment that number is selected to be large enough to average out local flip-flop variation and pulse generation circuitry variation in the main ring oscillator. Within the reference ring oscillator, this will also average out local variation in the components used to construct the individual reference unit cells.

There are a number of ways in which the measurement circuitry of the described embodiments can be utilised. In one embodiment, the flip-flops within the main ring oscillator are constructed from a flip-flop standard cell of a standard cell library, and the measured clock node to output node delay of the flip-flop is used to provide characterisation data for the flip-flop standard cell. In particular, this provides an accurate and simple mechanism for producing that characterisation data, which is then stored in association with the standard cell library for use when designing integrated circuits using the standard cell library components.

In an alternative embodiment, the measurement circuitry of the described embodiments can be used to perform online, in situ, run-time measurements within a data processing system, so that the measurement circuitry operates like a form of sensor to output C-Q delay measurements that can be used to determine an operating characteristic of the data processing system. In particular, in accordance with a second aspect of the present invention, there is provided a data processing system occupying a die area, comprising: at least one instance of measurement circuitry in accordance with the first aspect of the present invention, and control circuitry configured to utilise the measured clock node to output node delay of the flip-flop output by each of said at least one instances during operation of said data processing system to determine at least one operating characteristic of the data processing system.

The operating characteristic can take a variety of forms, but one embodiment could be a process characteristic associated with the manufacturing of the data processing system, for example identifying whether the data processing system is at a fast or slow corner of the process characteristic.

Whilst in one embodiment the data processing system may include a single instance of the measurement circuitry, in another embodiment a plurality of instances of the measurement circuitry are provided, arranged at different physical locations within the die area. In such an embodiment, the control circuitry may be configured to use the measured clock node to output node delay of the flip-flop output by each of the instances during operation of the data processing system to determine a variation in said at least one operating characteristic.

A number of different types of variation in the operating characteristic can be determined. For example, if the outputs from the multiple instances are averaged, this can remove spatial variations and provide an output indicative of the global variation (the global variation varying between dies but being fixed for a particular die). If instead a standard deviation is determined from the outputs from the multiple instances, this can give an indication of the spatial variation across the die area.

In another embodiment, it is possible to evaluate local variations in the operating characteristics. In particular, in one embodiment, the plurality of instances are arranged into groups of instances, the instances in each group being located close to each other, and at least one instance in the group having significantly more main unit cells in the main ring oscillator than in another instance of the group. In one particular embodiment, each group contains a pair of instances, with one instance having a relatively long chain of main unit cells (and associated reference unit cells), and the other instance having a relatively short chain of main unit cells (and associated reference unit cells). Since both instances in the pair are placed close to each other, they will have the same spatial variation, so that the spatial variation factor is removed when the two outputs are compared. They would also have the same global variation. Accordingly, by subtracting the outputs from the two instances in the pair, this can give an indication of the local variation in the operating characteristic.

Viewed from a third aspect, the present invention provides a method of measuring a clock node to output node delay of a flip-flop comprising: providing a main ring oscillator consisting of a plurality of main unit cells arranged sequentially to form a main ring, each main unit cell comprising a flip-flop and pulse generation circuitry connected to the output node of the flip-flop; configuring the flip-flop to be responsive to receipt of an input clock pulse at the clock node to output a data value transition from the output node, and using the pulse generation circuitry to generate from the data value transition an input clock pulse for a next main unit cell in the main ring, whereby the main ring oscillator generates a first output signal having a first oscillation period; employing a reference ring oscillator, consisting of a plurality of reference unit cells arranged sequentially to form a reference ring, to generate a second output signal having a second oscillation period, each reference unit cell comprising components configured such that the second oscillation period provides an indication of a propagation delay through the pulse generation circuitry of the main unit cells of the main ring during the first oscillation period; and determining the clock node to output node delay of the flip-flop from the first oscillation period and the second oscillation period.

Viewed from a fourth aspect, the present invention provides measurement circuitry for measuring a clock node to output node delay of a flip-flop means comprising: a main ring oscillator consisting of a plurality of main unit cell means for forming a main ring, each main unit cell means comprising a flip-flop means and pulse generation means for connecting to the output node of the flip-flop means, the flip-flop means for outputting, in response to receipt of an input clock pulse at the clock node, a data value transition from the output node, and the pulse generation means for generating from the data value transition an input clock pulse for a next main unit cell means in the main ring, whereby the main ring oscillator generates a first output signal having a first oscillation period; a reference ring oscillator consisting of a plurality of reference unit cell means for forming a reference ring, and for generating a second output signal having a second oscillation period, each reference unit cell means comprising components configured such that the second oscillation period provides an indication of a propagation delay through the pulse generation means of the main unit cell means of the main ring during the first oscillation period; and calculation means for determining the clock node to output node delay of the flip-flop means from the first oscillation period and the second oscillation period.

BRIEF DESCRIPTION OF THE DRAWINGS

The present invention will be described further, by way of example only, with reference to embodiments thereof as illustrated in the accompanying drawings, in which.

DESCRIPTION OF EMBODIMENTS

Figure 1:
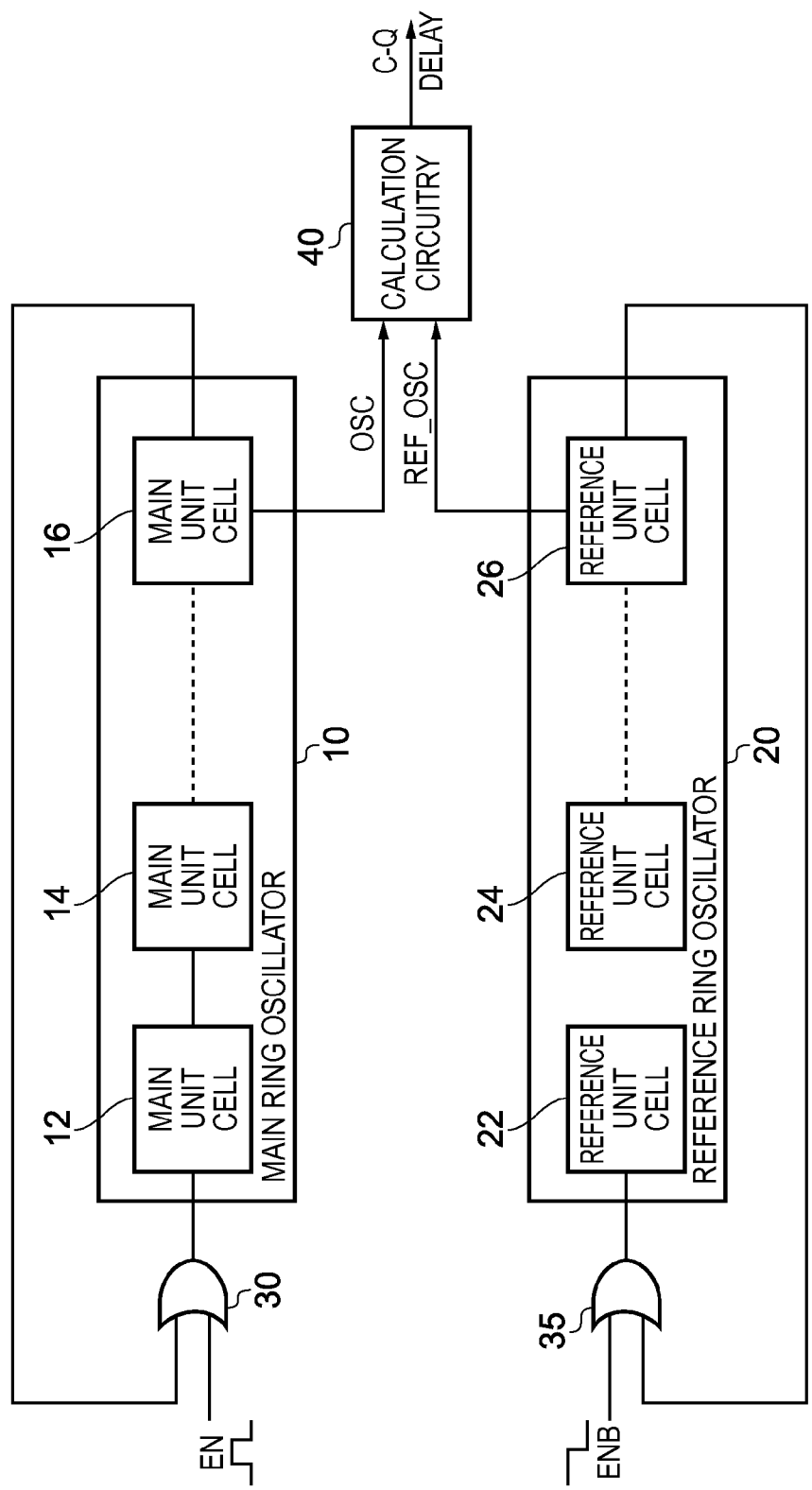
FIG. 1 is a block diagram of measurement circuitry in accordance with one embodiment.

FIG. 1 is a block diagram schematically illustrating measurement circuitry in accordance with one embodiment. The measurement circuitry comprises a main ring oscillator 10 and a reference ring oscillator 20. The main ring oscillator 10 includes a plurality of main unit cells 12, 14, 16, and similarly the reference ring oscillator 20 includes a plurality of reference unit cells 22, 24, 26. The reference ring oscillator in the embodiment of FIG. 1 is arranged to have the same number of reference unit cells as the number of main unit cells provided in the main ring oscillator. That number can vary dependent on embodiments, but in one embodiment that number N is equal to 4n+2, where n is a positive integer. In one particular embodiment, it has been found that this formulation of N is a requirement to make the reference ring oscillate correctly. However, in other implementations such a restriction may not be required.

At initialisation time, both the main ring oscillator and the reference ring oscillator are arranged to receive a suitable enable signal. The circuitry used to incorporate the enable signal into the ring can take a variety of forms, but in the embodiment shown in FIG. 1 takes the form of the logical OR gates 30, 35. For the main ring oscillator, the enable signal takes the form of a clock pulse that is then propagated on to the main unit cell 12. For the reference ring oscillator, the enable signal takes the form of an edge transition. The direction of the edge transition will vary dependent on implementation, but in one particular implementation the edge transition of the enable signal is a logic high to logic low transition.

The main ring oscillator 10 is used to generate an output oscillation signal (OSC) which is captured from the final main unit cell 16 in the ring. Similarly, the reference ring oscillator 20 is arranged to generate a reference output oscillation signal (REF_OSC) which is captured from a final reference unit cell 26 in the reference ring oscillator. Both of these output oscillation signals are forwarded to calculation circuitry 40. As will be discussed further herein, by using both of these signals, it is possible for the calculation circuitry to accurately calculate the C-Q delay.

Each main unit cell comprises a flip-flop, and pulse generation circuitry connected to the output node Q of the flip-flop to generate an input clock pulse for the next main unit cell in the ring, in response to an edge transition appearing at the output node Q of the flip-flop. The pulse generation circuitry can take a variety of forms, but in one particular embodiment takes the form shown in FIG. 2. In particular, in this embodiment a main ring oscillator 10 consisting of six main unit cells 12, 14, 50, 55, 60, 16 is shown. Each of the main unit cells is identically constructed. As is clear from FIG. 2, the pulse generation circuitry consists of a 2:1 multiplexer circuit, along with two inverters and two buffers. The multiplexer circuit can be constructed in a variety of ways, as will be understood by those skilled in the art.

Considering the main unit cell 12, the output node Q of the flip-flop 70 is connected via an inverter 75 to a first input of the multiplexer 85, and via a buffer 80 to the second input of the multiplexer 85. The output from the inverter 75 is passed via a buffer 90 (provided to ensure that the hold time of the flip-flop 70 is not violated) to the input node of the flip-flop 70. The output of the buffer 90 is also routed via an inverter 95 to a control input of the multiplexer 85.

Each of the unit cells is arranged in an identical manner. Accordingly, considering unit cell 14, it will be appreciated that the components 100, 105, 110, 115, 120 and 125 correspond to the components 70, 75, 80, 85, 90 and 95 of the main unit cell 12.

The unit cell 16 is also identically arranged, but only the multiplexer 140, and the inverter 130 and buffer 135 providing its inputs, are shown. In this particular embodiment, the output oscillation signal OSC produced by the main ring oscillator is taken from one of the inputs to the multiplexer 140, in particular in this embodiment from the input provided by the output of the buffer 135.

Figure 2:
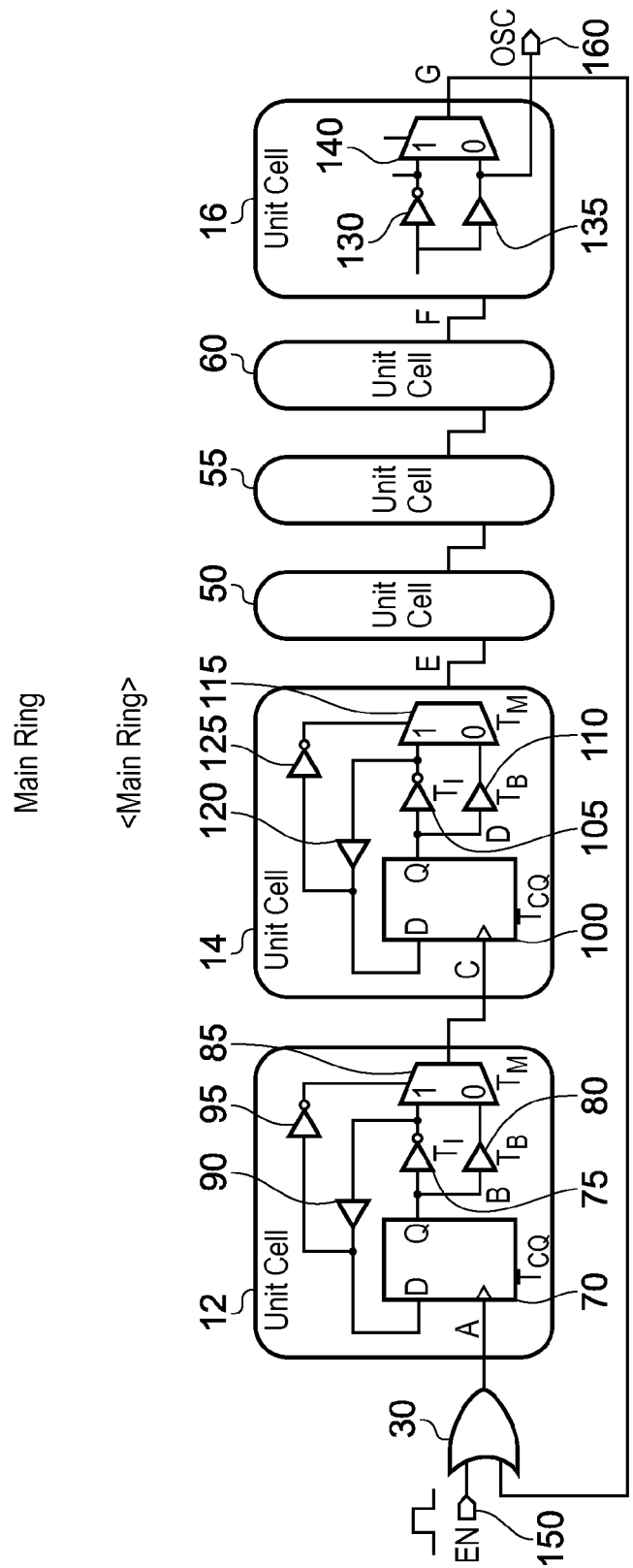
FIG. 2 illustrates in more detail the construction of the main ring oscillator of FIG. 1 in accordance with one embodiment.
Figure 3:
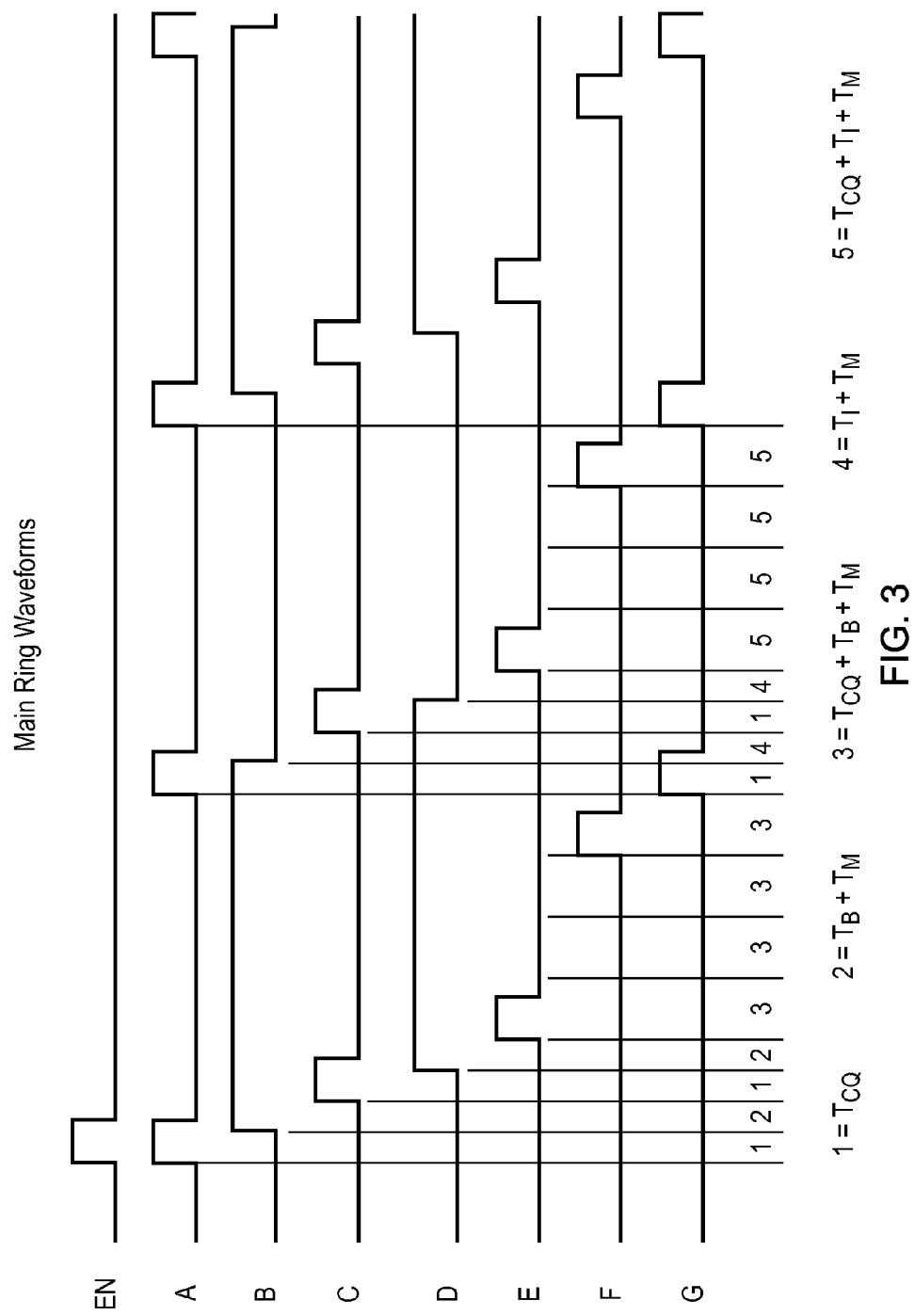
FIG. 3 is a timing diagram illustrating the operation of the circuitry of FIG. 2 in accordance with one embodiment.

FIG. 3 is a timing diagram illustrating the relative timing of various signals shown in FIG. 2 in accordance with one embodiment. The timing between the various relevant transitions is also shown in FIG. 3 by the numbers 1 to 5, with the components contributing to those timings being identified by the time quantities T indicated. In particular, the delay $T_{CQ}$ represents the C-Q delay of the flip-flop, whilst $T_I$, $T_B$ and $T_M$ indicate the delays of the inverter, buffer and multiplexer, respectively (those delay timings having been indicated directly in FIG. 2 for clarity).

As can be seen, when the enable signal is asserted at the pin 150, this causes a pulse to appear at point A, i.e. the clock input to the flip-flop 70. At initialisation time, it is assumed that the output node Q is at a logic zero level, as a result of which the input node will be at a logic one level. Accordingly, a short time later (due to the C-Q delay), the signal B transitions high, and a short time later this will cause the signal C to transition high, this time delay being due to the delay through the buffer 80 and the multiplexer 85.

At initialisation time, it is assumed that the output node Q for all of the flip-flops is at a logic zero level, with the corresponding input nodes hence being primed at a logic one level, and accordingly following assertion of the clock pulse on signal line C, the output signal D transitions to a logic high level following the C-Q delay within the flip-flop 100. This then causes the output signal E to transition high, and in particular to generate a pulse for outputting to the unit cell 50, with the delay between the transition of signal D and the transition of signal E being due to the delay through the buffer 110 and multiplexer 115. This same timing ripples through the rest of the main unit cells, with the signal at points F and G being shown in FIG. 3.

The signal at point G is routed back to the clock input A of the first unit cell 12. However, at this point the output node Q of each flip-flop in each of the main unit cells is at a logic one level, and the input node of each flip-flop is primed to a logic zero level. Accordingly, following assertion of the pulse at node G, this will a short time later cause the value of the signal at point B to transition back to a logic zero level. This time, the path through the inverter 75 and the multiplexer 85 will be used to generate the pulse, and accordingly the delay between the transition of the signal B to the logic zero value, and the generation of the pulse on line C is due to the delay through the inverter 75 and the multiplexer 85.

This process then ripples through the remainder of the main unit cells. It will be appreciated that the oscillation output signal OSC appearing at the node 160 will have a waveform similar to that of the nodes B, D. The oscillation period of that signal is given by the following equation:

$$T_{P,OSC} = 2N \times T_{CQ} + 2N \times T_M + N \times (T_B + T_I) \quad \text{[Equation 1]}$$

In the above equation, N indicates the number of main unit cells in the main ring oscillator.

As will be appreciated from equation 1, the oscillation period includes not only a delay period due to the C-Q delay of the flip-flops, but also components due to delays through the inverters, buffers and multiplexers. To enable these additional components to be removed, the reference ring oscillator is used. In one particular embodiment, the reference ring oscillator takes the form shown in FIG. 4. In this design, every alternate reference unit cell has the same configuration, and accordingly the reference unit cells 22, 200, 210 are identically constructed, and similarly the reference unit cells 24, 205, 26 are identically constructed. The first unit cell 22 consists of an inverter 215 connected to a first input of a multiplexer 220. The second input of the multiplexer is connected to ground, and the multiplexer is hardwired to select the first input, namely the output from the inverter 215.

Similarly, the second reference ring oscillator 24 has a multiplexer 230, but in this instance the first input is set to ground, and the second input is provided by the output of the buffer 225. Further, the multiplexer's control signal is set to ground to ensure that the output from the buffer 225 is selected as the output from the multiplexer. The reference oscillation signal REF_OSC is taken from the output of the buffer in the final unit cell 26. The ring is triggered to begin oscillating by insertion of an edge transition via the pin 240. In one particular embodiment, the enable signal taking the form of a logic high to logic low transition. As will be appreciated from the circuitry of FIG. 4, this causes the edge transition to be propagated through the ring, and by the time that edge transition has been propagated twice through the ring, this will produce a full cycle of the reference oscillation signal, with the oscillation period being given by the following equation:

$$T_{P,REF\_OSC} = 2N \times T_M + N \times (T_B + T_I) \quad \text{[Equation 2]}$$

Given that the main ring oscillator and the reference ring oscillator have the same number of unit cells, then the C-Q delay can be found by subtracting the above oscillation period of equation 2 from the oscillation period of equation 1 discussed earlier, and in particular by the following equation:

$$T_{CQ} = (T_{P,OSC} - T_{P,REF\_OSC})/2N \quad \text{[Equation 3]}$$

Accordingly, it can be seen that such an approach provides an easy mechanism for accurately measuring the C-Q delay of a given flip-flop. Furthermore, if N is selected to be large enough, all of the local mismatches can be effectively cancelled out resulting in an accurate C-Q delay measurement.

Figure 4:
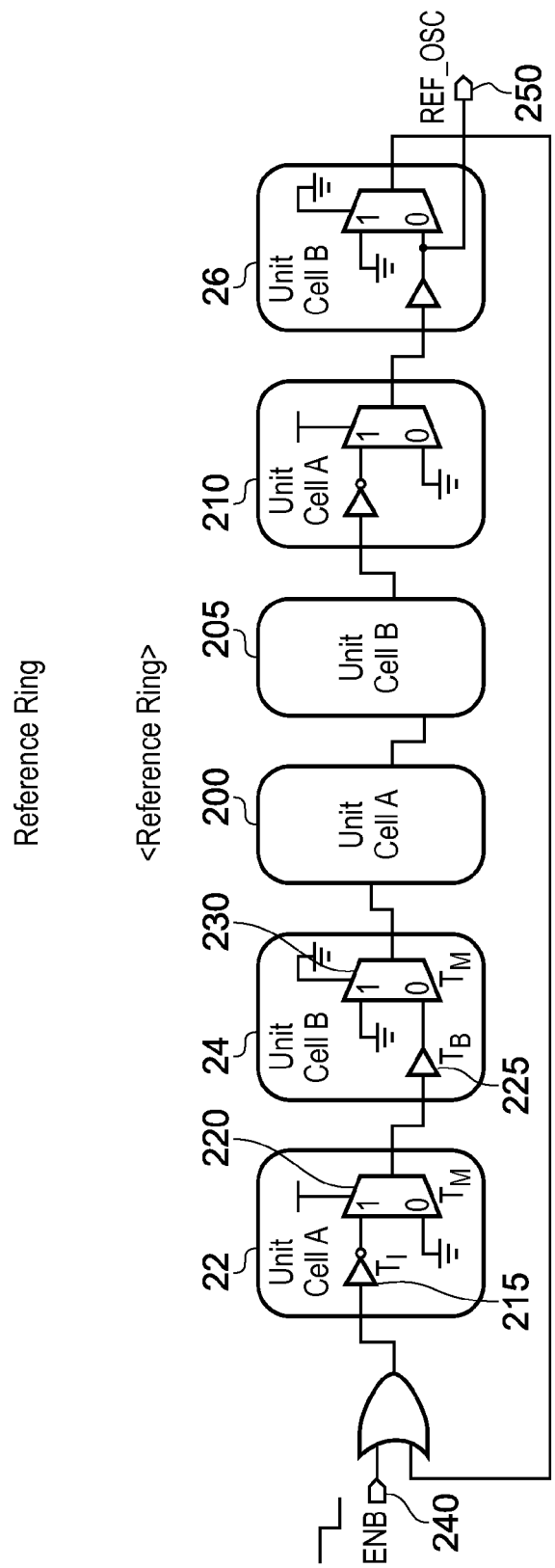
FIG. 4 illustrates in more detail the reference ring oscillator of FIG. 1 in accordance with one embodiment.
Figure 5:
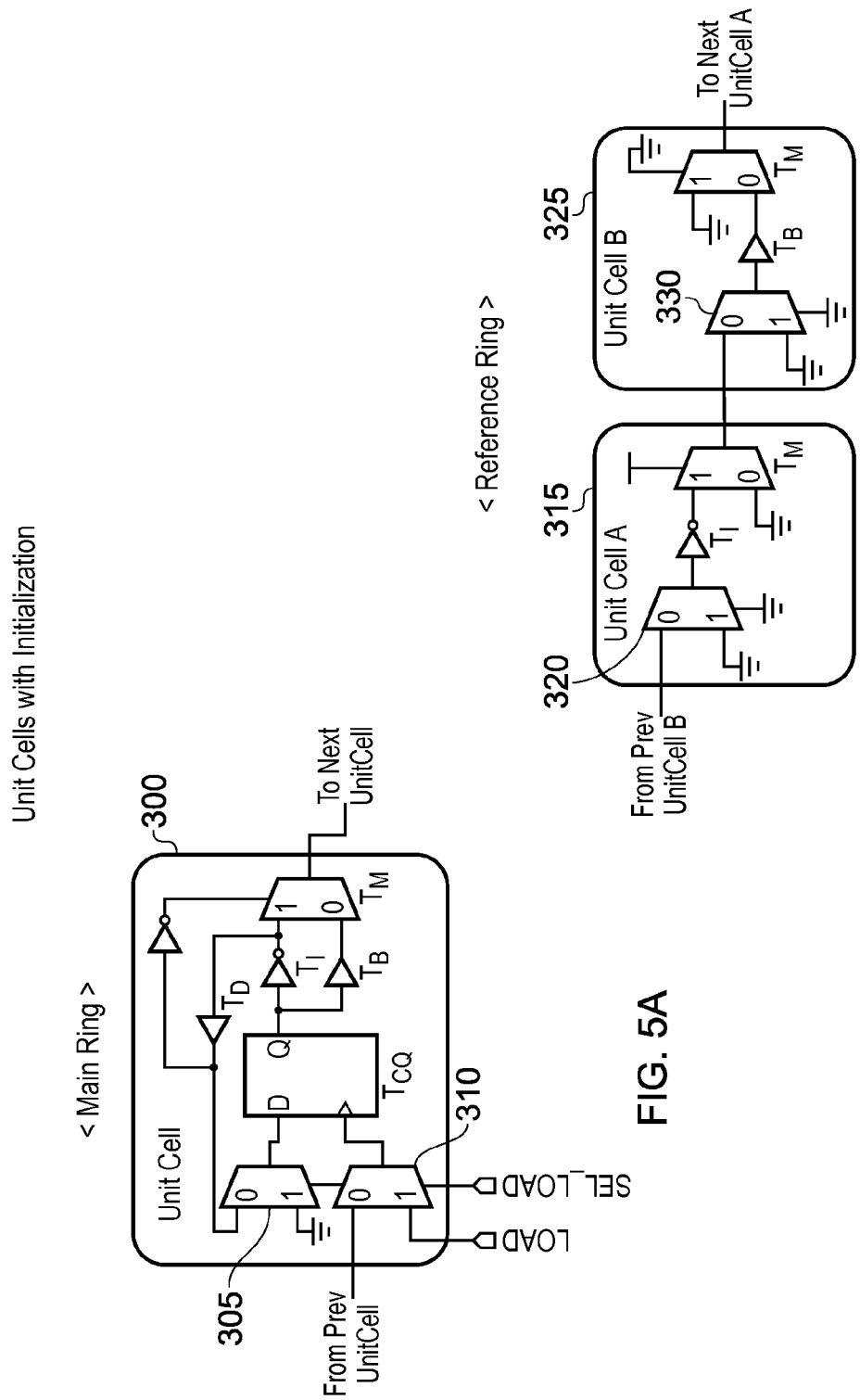
FIGS. 5A and 5B schematically illustrate components provided within the main unit cells and reference unit cells in accordance with an alternative embodiment.

It will be appreciated that in certain embodiments, the main unit cells and reference unit cells may include additional components over and above those shown in FIGS. 2 and 4. For example, FIGS. 5A and 5B show alternative forms of the main unit cell and reference unit cells that can be used, these variants including additional initialisation circuitry in the form of one or more multiplexer circuits. Considering first FIG. 5A, the initialisation circuitry includes the two multiplexers 305 and 310. During normal use, these multiplexers have no effect on the functional operation of the ring oscillators, which operate as discussed earlier with reference to FIGS. 2 to 4. However, during an initialisation process, a load signal is provided to the second input of the multiplexer 310, and a select load signal is provided to both multiplexers 305, 310, to cause them to select their second inputs. As a result, a logic zero value is provided to the input D, and on receipt of the asserted load signal at the clock input, the logic zero D input is propagated to the output Q, as a result of which the output Q is set to a logic zero value at initialisation time.

Referring now to FIG. 5B, the multiplexers 320, 330 within the two instances 315, 325 are provided merely to incorporate the same path delays as experienced in the main unit cell 300 due to the multiplexer 310, but do not affect the operation of the reference unit cells.

Figure 6:
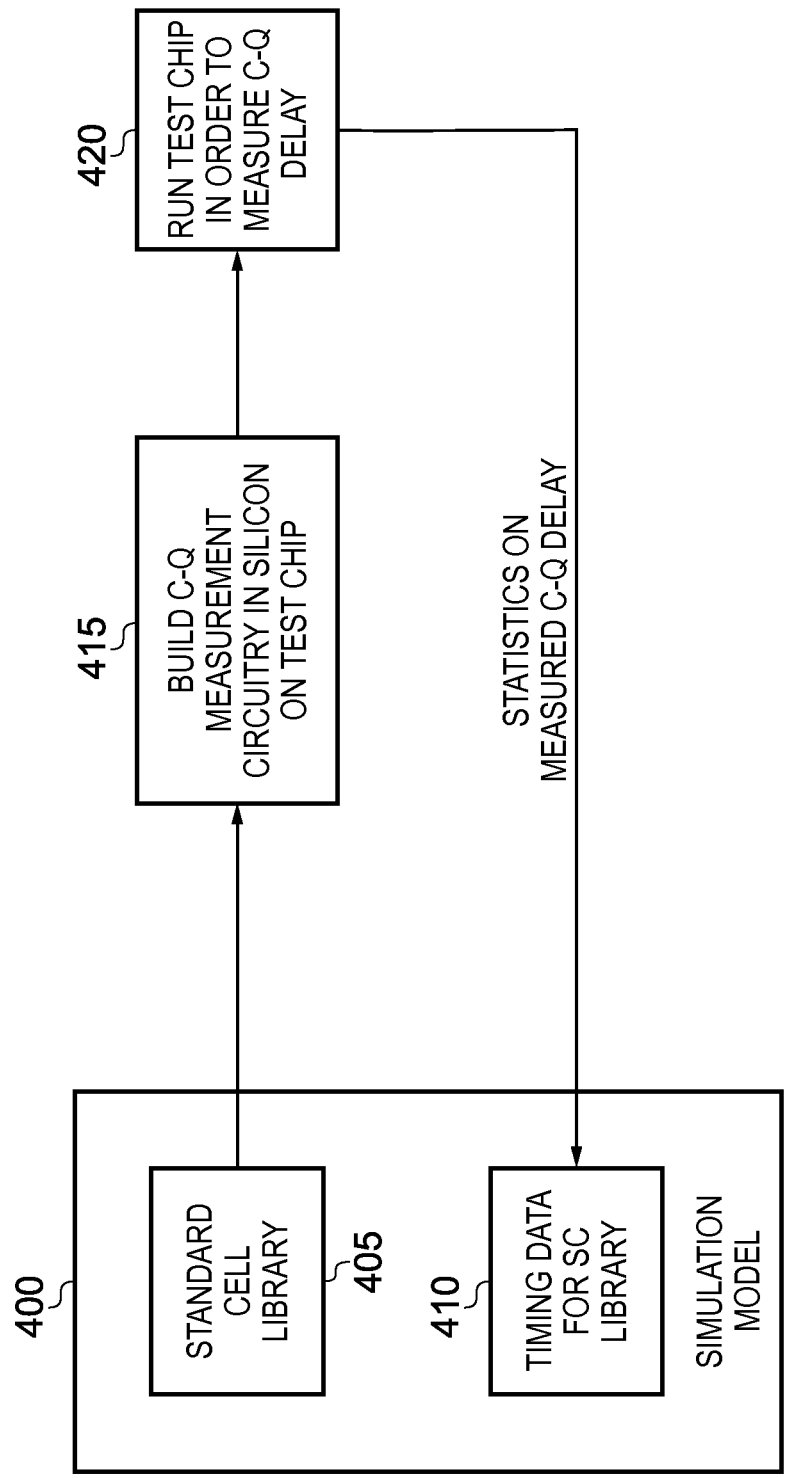
FIG. 6 illustrates one use case for the measurement circuits of the described embodiments.

FIG. 6 illustrates an example use case for the measurement circuits of the described embodiments. In this embodiment, a standard cell library 405 consisting of a plurality of standard cells is provided within a simulation model 400. At step 415, a C-Q measurement circuit is built in silicon on a test chip using components from the standard cell library. In particular, when using the implementations shown in FIG. 2, 4 or 5A, 5B, it will be appreciated that the measurement circuitry can be built directly from standard cell components. In this embodiment, it is desired to test the C-Q delay of a standard cell component defining the flip-flop.

Accordingly, once the test chip has been built at step 415, the test chip can be run at step 420 in order to measure the C-Q delay using the C-Q measurement circuitry, and that C-Q delay can be returned to the simulation model for storing within timing data 410 for the standard cell library. This timing data is specific to the process technology used for the test chip (for example 45 nm, 22 nm, etc.).

Whilst in one embodiment the C-Q delay can be returned directly to include within the timing data 410, in an alternative embodiment control circuitry may be provided to determine other statistics related to the measured C-Q delay, and return those statistics for incorporation within the timing data 410. For example, multiple instances of the measurement circuitry could be included in the test chip, with the outputs from those multiple instances being used to determine one or more operating characteristics of the test chip.

Figure 7:
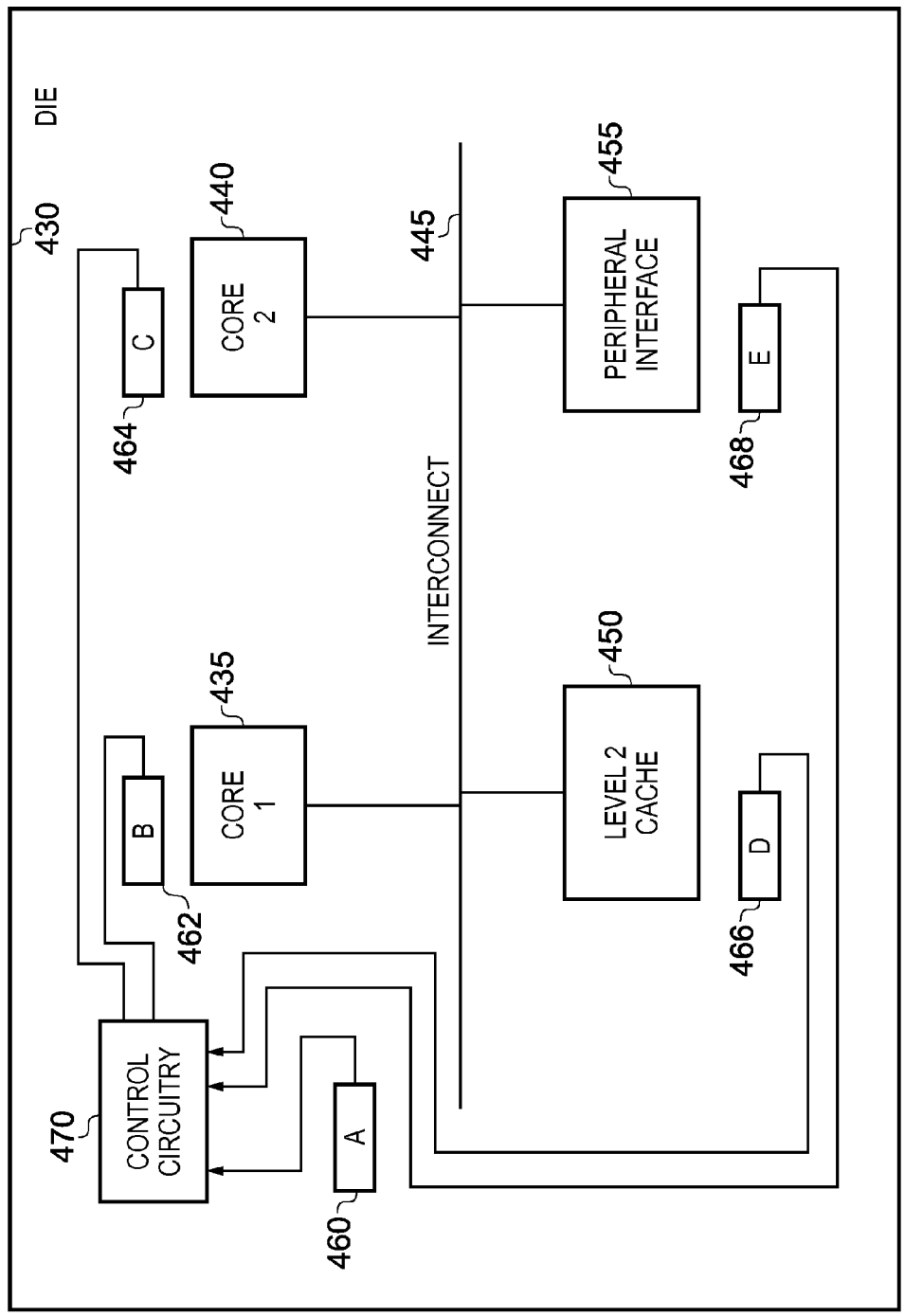
FIG. 7 illustrates a different use case for the measurement circuits of the described embodiments.

As an alternative to employing the measurement circuits within a test chip, such as shown in FIG. 6, the measurement circuits can also be used to provide in-situ, run-time measurements within a data processing system, in which case the measurement circuits can be viewed as a type of sensor. FIG. 7 illustrates one such example deployment of the measurement circuits. In this embodiment, a data processing system is produced on a die 430. The data processing system can take a variety of forms, but for the sake of illustration a data processing system consisting of multiple processing cores 435, 440, connected via an interconnect 445 with a level 2 cache 450 and a peripheral interface 455 is considered. A number of measurement circuits 460, 462, 464, 466, 468 may be distributed throughout the die area. Whilst the location can be varied as desired, in one embodiment one or more of the measurement circuits will be placed in close proximity to certain functional units within the data processing system. In this example, separate measurement circuits 462, 464, 466, 468 are provided in close proximity to the functional units 435, 440, 450, 455.

Control circuitry 470 is arranged to receive the output C-Q delay measurements from each of the measurement circuits, and is arranged to determine at least one operating characteristic from those outputs. The operating characteristic can take a variety of forms, but in one embodiment is a process characteristic, which will vary dependent on the manufacturing process. For example, when manufacturing on silicon, the process characteristic is known to vary between fast and slow process corners.

In one embodiment, each of the various measurement circuits 460, 462, 464, 466, 468 is identically constructed, and the outputs from each will include the same global variation parameter (a parameter that varies between individual dies, but is the same for any particular die). However, there will be some inaccuracy in any individual output due to spatial variations that can occur within the die. By averaging the outputs from the various measurement circuits, the control circuitry can effectively remove the spatial variation factor, thereby producing an accurate indication of the global variation parameter. Alternatively, by calculating a standard deviation based on the outputs from the various measurement sensors, a measure of the spatial variation can be obtained.

In a yet further embodiment, each of the instances 460, 462, 464, 466, 468 may actually consist of a pair of measurement circuits, each measurement circuit being constructed as per the earlier described embodiments, but one measurement circuit in the pair having a relatively large number of unit cells in each of the main and reference rings, whilst the other measurement circuit in the pair has a relatively small number of unit cells in each of the main and reference rings. Both measurement circuits of the pair are placed very close to each other, as a result of which both measurement circuits will be exposed to the same spatial variation component. In addition, the global variation will be the same for both measurement circuits. Accordingly by subtracting the output of one measurement circuit from the output of the other measurement circuit, an indication of a local variation parameter can be obtained.

Figure 8:
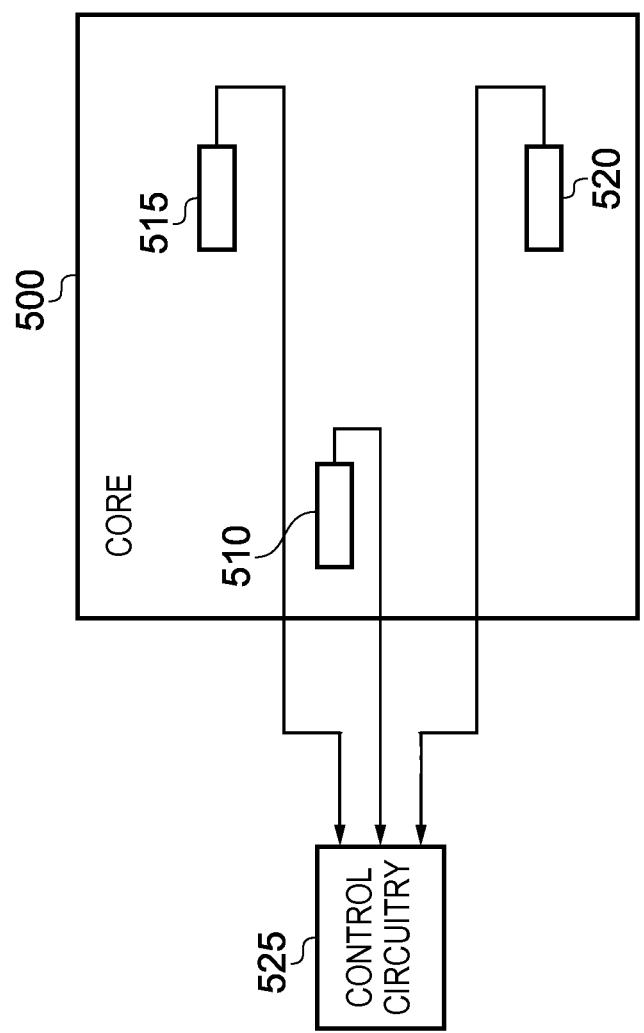
FIG. 8 illustrates a yet further use case for the measurement circuits of the described embodiments.

Whilst in FIG. 7 it is assumed that the various measurement circuits are distributed at the System-on-Chip (SoC) level, the same techniques can be performed at different levels of granularity within the system. For example, as shown in FIG. 8, multiple measurement circuits may be distributed within certain functional components, for example a core 500 as shown in FIG. 8. Hence in this example a plurality of measurement circuits 510, 515, 520 are distributed within the area occupied by the core, and provide outputs to an associated control circuit 525. This enables variations in the operating parameter across a relatively large component such as a core, or indeed a level 2 cache, to be measured.

As will be apparent from the above described embodiments, those embodiments provide a particularly simple and accurate measurement circuit for determining a C-Q delay within a flip-flop. The measurement circuits of the described embodiments can be readily implemented using standard digital components, such as the components available in a standard cell library, and do not require any complex analog components, thereby making the measurement circuits particularly cheap and easy to implement within a data processing system.

Although particular embodiments have been described herein, it will be appreciated that the invention is not limited thereto and that many modifications and additions thereto may be made within the scope of the invention. For example, various combinations of the features of the following dependent claims could be made with the features of the independent claims without departing from the scope of the present invention.

We claim:

1. Measurement circuitry for measuring a clock node to output node delay of a flip-flop comprising:
   a main ring oscillator consisting of a plurality of main unit cells arranged sequentially to form a main ring, each main unit cell comprising a flip-flop and pulse generation circuitry connected to the output node of the flip-flop, the flip-flop being configured to be responsive to receipt of an input clock pulse at the clock node to output a data value transition from the output node, and the pulse generation circuitry being configured to generate from the data value transition an input clock pulse for a next main unit cell in the main ring, whereby the main ring oscillator generates a first output signal having a first oscillation period;
a reference ring oscillator consisting of a plurality of reference unit cells arranged sequentially to form a reference ring, and configured to generate a second output signal having a second oscillation period, each reference unit cell comprising components configured such that the second oscillation period provides an indication of a propagation delay through the pulse generation circuitry of the main unit cells of the main ring during the first oscillation period; and
calculation circuitry configured to determine the clock node to output node delay of the flip-flop from the first oscillation period and the second oscillation period.

2. Measurement circuitry as claimed in claim 1, wherein within each main unit cell the pulse generation circuitry is further configured to precondition an input node of the flip-flop such that the data value transition occurs each time an input clock pulse is received at the clock node of the flip-flop.

3. Measurement circuitry as claimed in claim 1, wherein the pulse generation circuitry is configured to generate the input clock pulse for a next main unit cell in the main ring in response to the data value transition being a logic high to logic low transition and in response to the data value transition being a logic low to logic high transition.

4. Measurement circuitry as claimed in claim 3, wherein:
the pulse generation circuitry comprises multiplexer circuitry configured to receive as multiplexer inputs both an inverted and a non-inverted version of the data value at the output node of the flip-flop;
on occurrence of said data value transition at the output node of the flip-flop, the multiplexer circuitry being configured to initially output the multiplexer input that is transitioning in a first predetermined direction, and then to switch the output to the other multiplexer input, thereby creating said input clock pulse for the next main unit cell.

5. Measurement circuitry as claimed in claim 4, wherein said first predetermined direction is a logic low to logic high direction.

6. Measurement circuitry as claimed in claim 4, wherein the first output signal is provided by one of the multiplexer inputs to the multiplexer circuitry in a predetermined one of the main unit cells, and the input clock pulse is configured to propagate twice around the main ring during the first oscillation period.

7. Measurement circuitry as claimed in claim 1, wherein the components in each reference unit cell are hardwired so that, after an input edge transition has been propagated a predetermined number of times around the reference ring, the second oscillation period provides an indication of the propagation delay through the pulse generation circuitry of the main unit cells of the main ring during the first oscillation period.

8. Measurement circuitry as claimed in claim 7, wherein every alternate reference unit cell is identically constructed.

9. Measurement circuitry as claimed in claim 1, wherein the pulse generation circuitry consists solely of interconnected digital components.

10. Measurement circuitry as claimed in claim 1, wherein the number of main unit cells in the main ring oscillator is selected to be large enough to average out local flip-flop variation and pulse generation circuitry variation in the main ring oscillator.

11. Measurement circuitry as claimed in claim 1, wherein the flip-flops within the main ring oscillator are constructed from a flip-flop standard cell of a standard cell library, and the measured clock node to output node delay of the flip-flop is used to provide characterisation data for the flip-flop standard cell.

12. A data processing system occupying a die area, comprising:
at least one instance of measurement circuitry as claimed in claim 1;
control circuitry configured to utilise the measured clock node to output node delay of the flip-flop output by each of said at least one instances during operation of said data processing system to determine at least one operating characteristic of the data processing system.

13. A data processing apparatus as claimed in claim 12, wherein said at least one instance of said measurement circuitry comprises a plurality of instances of said measurement circuitry arranged at different physical locations within the die area, and said control circuitry is configured to use the measured clock node to output node delay of the flip-flop output by each of said instances during operation of said data processing system to determine a variation in said at least one operating characteristic.

14. A data processing apparatus as claimed in claim 13, wherein the plurality of instances are arranged into groups of instances, the instances in each group being located close to each other, and at least one instance in the group having significantly more main unit cells in the main ring oscillator than in another instance of the group.

15. A method of measuring a clock node to output node delay of a flip-flop comprising:
providing a main ring oscillator consisting of a plurality of main unit cells arranged sequentially to form a main ring, each main unit cell comprising a flip-flop and pulse generation circuitry connected to the output node of the flip-flop;
configuring the flip-flop to be responsive to receipt of an input clock pulse at the clock node to output a data value transition from the output node, and using the pulse generation circuitry to generate from the data value transition an input clock pulse for a next main unit cell in the main ring, whereby the main ring oscillator generates a first output signal having a first oscillation period;
employing a reference ring oscillator, consisting of a plurality of reference unit cells arranged sequentially to form a reference ring, to generate a second output signal having a second oscillation period, each reference unit cell comprising components configured such that the second oscillation period provides an indication of a propagation delay through the pulse generation circuitry of the main unit cells of the main ring during the first oscillation period; and
determining the clock node to output node delay of the flip-flop from the first oscillation period and the second oscillation period.

16. Measurement circuitry for measuring a clock node to output node delay of a flip-flop means comprising:
a main ring oscillator consisting of a plurality of main unit cell means for forming a main ring, each main unit cell means comprising a flip-flop means and pulse generation means for connecting to the output node of the flip-flop means, the flip-flop means for outputting, in response to receipt of an input clock pulse at the clock node, a data value transition from the output node, and the pulse generation means for generating from the data value transition an input clock pulse for a next main unit cell means in the main ring, whereby the main ring oscillator generates a first output signal having a first oscillation period;

a reference ring oscillator consisting of a plurality of reference unit cell means for forming a reference ring, and for generating a second output signal having a second oscillation period, each reference unit cell means comprising components configured such that the second oscillation period provides an indication of a propagation delay through the pulse generation means of the main unit cell means of the main ring during the first oscillation period; and calculation means for determining the clock node to output node delay of the flip-flop means from the first oscillation period and the second oscillation period.

* * * * *